(12) United States Patent
Motomura et al.

(10) Patent No.: US 11,877,397 B2
(45) Date of Patent: Jan. 16, 2024

(54) PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Koka (JP)

(72) Inventors: Junichi Motomura, Osaka (JP); Koji Nitta, Osaka (JP); Shoichiro Sakai, Osaka (JP); Mari Sogabe, Osaka (JP); Mitsutaka Tsubokura, Osaka (JP); Akira Tsuchiko, Osaka (JP); Masashi Iwamoto, Koka (JP)

(73) Assignees: SUMITOMO ELECTRIC INDUSTRIES, LTD., Osaka (JP); SUMITOMO ELECTRIC PRINTED CIRCUITS, INC., Koka (JP)

( * ) Notice: Subject to any disclaimer, the term of this patent is extended or adjusted under 35 U.S.C. 154(b) by 286 days.

(21) Appl. No.: 17/605,939

(22) PCT Filed: May 15, 2020

(86) PCT No.: PCT/JP2020/019432
§ 371 (c)(1),
(2) Date: Oct. 22, 2021

(87) PCT Pub. No.: WO2020/230888
PCT Pub. Date: Nov. 19, 2020

(65) Prior Publication Data
US 2022/0225500 A1 Jul. 14, 2022

(30) Foreign Application Priority Data
May 15, 2019 (JP) .................................. 2019-092388

(51) Int. Cl.
*H05K 1/09* (2006.01)
*C25D 3/38* (2006.01)

(52) U.S. Cl.
CPC ................. *H05K 1/09* (2013.01); *C25D 3/38* (2013.01); *H05K 2201/0355* (2013.01)

(58) Field of Classification Search
CPC ............................................ H05K 1/09–1/097
See application file for complete search history.

(56) References Cited

FOREIGN PATENT DOCUMENTS

| JP | H10-233579 A | 9/1998 |
|---|---|---|
| JP | 2000-252622 A | 9/2000 |

(Continued)

OTHER PUBLICATIONS

Jul. 28, 2020 International Search Report issued in International Patent Application No. PCT/JP2020/019432.

*Primary Examiner* — Jeremy C Norris
(74) *Attorney, Agent, or Firm* — Oliff PLC

(57) ABSTRACT

The printed circuit board includes, a first conductive layer including copper foil, an insulating base layer, and a second conductive layer including copper foil in this order, and includes a via-hole laminate that is stacked on an inner circumference and a bottom of a connection hole extending through the first conductive layer and the base layer in a thickness direction. The via-hole laminate has an electroless copper plating layer stacked on the connection hole and an electrolytic copper plating layer stacked on the electroless copper plating layer. The copper foil has copper crystal grains oriented in a (100) plane orientation, and an average crystal grain size of copper of 10 μm or more. The electroless copper plating layer includes palladium and tin, and an amount of the palladium stacked per unit area of a surface of the copper foil is 0.18 μg/cm² or more and 0.40 μg/cm² or less.

6 Claims, 1 Drawing Sheet

(56) References Cited

FOREIGN PATENT DOCUMENTS

| | | |
|---|---|---|
| JP | 2003-209330 A | 7/2003 |
| JP | 2004-214410 A | 7/2004 |
| JP | 2009-071132 A | 4/2009 |
| WO | 2008-050584 A1 | 5/2008 |

PRINTED CIRCUIT BOARD

TECHNICAL FIELD

The present disclosure relates to a printed circuit board.
The present application claims priority based on Japanese Patent Application No. 2019-092388 filed on May 15, 2019, and the entire contents of the Japanese patent application are incorporated herein by reference.

BACKGROUND ART

In recent years, electronic devices have been reduced in size, and there has been a demand for realization of high-density wiring of printed circuit boards used in such electronic devices. To meet this demand, a multilayer printed circuit board having a plurality of patterned conductive layers is often used. In such a multilayer printed circuit board, to connect patterns of different conductive layers to each other, for example, a via-hole is provided so as to extend through a base layer that has metal foil stacked, as conductive layers, on the front surface side and the back surface side thereof. In this via-hole, an electroless copper plating layer and an electrolytic copper plating layer are formed on an inner circumferential surface of a hole extending through the base layer (refer to Japanese Unexamined Patent Application Publication No. 2004-214410).

CITATION LIST

Patent Literature

PTL 1: refer to Japanese Unexamined Patent Application Publication No. 2004-214410

SUMMARY OF INVENTION

A printed circuit board according to the present disclosure includes an insulating base layer, a first conductive layer that is stacked on a front surface of the base layer either directly or indirectly and that includes copper foil, a second conductive layer that is stacked on a back surface of the base layer either directly or indirectly and that includes copper foil, and a via-hole laminate that is stacked on an inner circumference and a bottom of a connection hole extending through the first conductive layer and the base layer in a thickness direction and that electrically connects the first conductive layer to the second conductive layer. The via-hole laminate has an electroless copper plating layer that is stacked on the inner circumference and the bottom of the connection hole and an electrolytic copper plating layer stacked on a surface of the electroless copper plating layer. The copper foil contains copper crystal grains oriented in a (100) plane orientation, and an average crystal grain size of copper of the copper foil is 10 μm or more. The electroless copper plating layer includes palladium and tin, and an amount of the palladium stacked per unit area of a surface of the copper foil is 0.18 μg/cm$^2$ or more and 0.40 μg/cm$^2$ or less.

DESCRIPTION OF EMBODIMENTS

Figure 1:
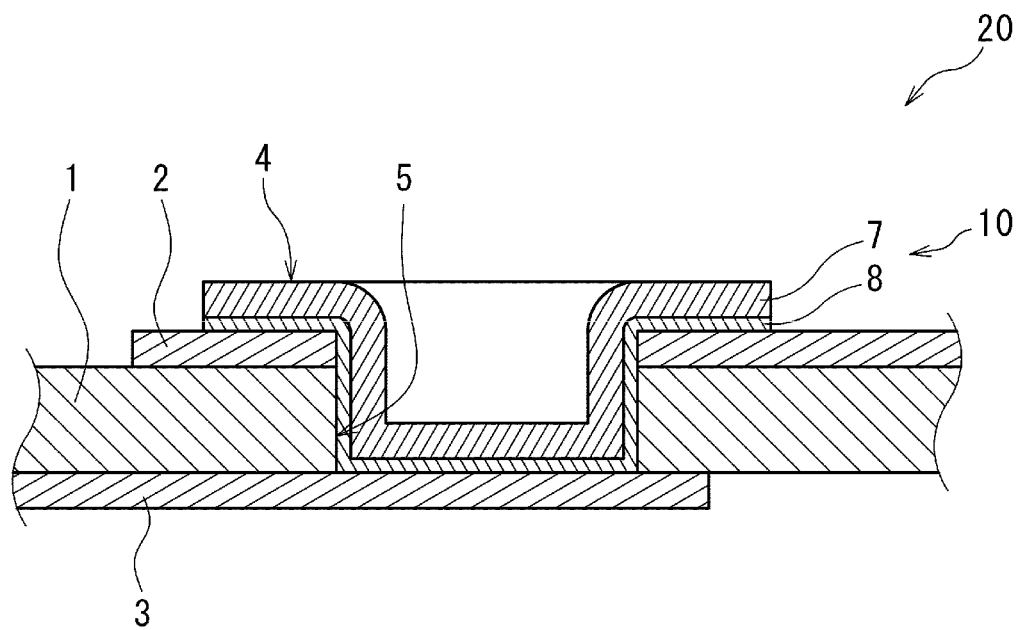
FIG. 1 is a schematic sectional view illustrating a printed circuit board according to an embodiment.

Problems to be Solved by Present Disclosure

In general, copper foil is widely used as wiring layers of the via-hole. A further improvement in mechanical properties such as flexibility has been desired for the copper foil. For example, in copper foil, studies such as the orientation of copper crystals and crystal grain size of copper have been conducted in order to improve mechanical properties. However, when electroless copper plating is performed on a surface of copper foil having a crystal orientation or a crystal grain size in a particular range, and copper electroplating is then performed, abnormal growth of copper crystals of the resulting electrolytic copper plating layer may occur partially. If abnormal growth of copper crystals occurs partially in this manner, irregularities are generated on the surface of the electrolytic copper plating layer, and consequently, the resulting printed circuit board may be erroneously detected as a defective product in an appearance inspection with an automated optical inspection system (AOI). Furthermore, since a large amount of copper has been deposited on protrusions generated on the surface of the electrolytic copper plating layer, copper is not sufficiently deposited on a bottom portion of the via-hole. As a result, the bottom portion of the via-hole may be separated from the conductive layer.

The present disclosure has been made under the circumstances described above. An object of the present disclosure is to provide a printed circuit board in which erroneous detection in an appearance inspection with an automated optical inspection system and separation of a bottom portion of a via-hole can be reduced.

Advantageous Effects of Present Disclosure

The present disclosure can provide a printed circuit board in which erroneous detection in an appearance inspection and separation of a bottom portion of a via-hole can be reduced.

Description of Embodiments of Present Disclosure

First, embodiments of the present disclosure will be listed and described.

A printed circuit board according to the present disclosure includes an insulating base layer, a first conductive layer that is stacked on a front surface of the base layer either directly or indirectly and that includes copper foil, a second conductive layer that is stacked on a back surface of the base layer either directly or indirectly and that includes copper foil, and a via-hole laminate that is stacked on an inner circumference and a bottom of a connection hole extending through the first conductive layer and the base layer in a thickness direction and that electrically connects the first conductive layer to the second conductive layer. The via-hole laminate has an electroless copper plating layer that is stacked on the inner circumference and the bottom of the connection hole and an electrolytic copper plating layer stacked on a surface of the electroless copper plating layer. The copper foil contains copper crystal grains oriented in a (100) plane orientation, and an average crystal grain size of copper of the copper foil is 10 μm or more. The electroless copper plating layer includes palladium and tin, and an amount of the palladium stacked per unit area of a surface of the copper foil is 0.18 μg/cm$^2$ or more and 0.40 μg/cm$^2$ or less.

The copper foil stacked on the front surface of the base layer of the printed circuit board contains crystal grains of copper oriented in the (100) plane orientation, and an average crystal grain size of the copper is 10 µm or more. In this case, the orientation of crystal grains of copper of the copper foil is easily carried over to crystal grains of copper deposited by electroless copper plating and crystal grains of copper deposited by electrolytic copper plating. As a result, an electroless copper plating layer and an electrolytic copper plating layer that have the same orientation as that of crystal grains of copper of the copper foil are formed. Accordingly, abnormal growth of crystals of copper of the electrolytic copper plating layer partially occurs, which may result in generation of irregularities on a surface of the electrolytic copper plating layer. In the printed circuit board, the electroless copper plating layer includes palladium which is a catalyst, and this suppresses the phenomenon that the orientation of the crystal grains of copper of the copper foil is carried over to crystal grains of copper deposited by electroless copper plating. As a result, the formation of irregularities on the surface of the electrolytic copper plating layer due to abnormal growth of copper crystals of the electrolytic copper plating layer is suppressed. Accordingly, in the printed circuit board, it is possible to reduce erroneous detection in an appearance inspection with an automated optical inspection system and separation of a bottom portion of a via-hole. Furthermore, in the printed circuit board, since the amount of the palladium stacked per unit area of the surface of the copper foil is 0.18 µg/cm² or more and 0.40 µg/cm² or less, the amount of core of the catalyst generated by electroless copper plating is increased to promote the growth of plating having an orientation different from that of copper crystal grains of the copper foil. Consequently, it is possible to enhance the effect of reducing the formation of an electroless copper plating layer having the same orientation as that of copper crystal grains of the copper foil. Accordingly, the effect of reducing erroneous detection in an appearance inspection with an automated optical inspection system and separation of a bottom portion of a via-hole can be improved. Furthermore, since the electroless copper plating layer includes, as the catalyst, tin in addition to palladium, the catalyst has a form of a tin-palladium colloidal solution. Therefore, since the amount of palladium stacked on the copper foil is easily increased, it is possible to further enhance the effect of reducing the formation of an electroless copper plating layer having the same orientation as that of copper crystal grains of the copper foil. Accordingly, the effect of reducing erroneous detection in an appearance inspection with an automated optical inspection system and separation of a bottom portion of a via-hole can be improved.

Herein, the "crystal grain size" is determined as follows. For example, a surface of copper foil used as a sample is subjected to crystal orientation analysis by an electron backscatter diffraction (EBSD) method to detect a crystal grain boundary, a region surrounded by this crystal grain boundary is defined as a crystal grain, and the diameter of a circle having the same area as the area of the region is defined as the crystal grain size of the crystal grain. The "average crystal grain size" refers to an average value of the crystal grain sizes of crystal grains that are present in a predetermined measurement field of view. The plane orientation of copper crystal grains of copper foil is calculated by the EBSD method by performing measurement a plurality of times at a position on the surface of the copper foil, the position being extracted at random. The "average thickness" refers to an average value of thicknesses measured at 10 random points.

An amount of the tin stacked per unit area of the surface of the copper foil is preferably 0.05 µg/cm² or more and 1.20 µg/cm² or less. When the amount of tin stacked is within the above range, the amount of palladium stacked on the copper foil can be adjusted to a satisfactory range, and it is possible to further improve the effect of reducing the formation of an electroless copper plating layer having the same orientation as that of copper crystal grains of the copper foil.

In the printed circuit board, a ratio of an area of copper crystal grains oriented in the (100) plane orientation and present on the surface of the copper foil relative to an area of the surface of the copper foil is preferably 50% or more. When the ratio of the area of copper crystal grains oriented in the (100) plane orientation and present on the surface of the copper foil relative to the area of the surface of the copper foil is 50% or more, the effect of reducing partial abnormal growth of copper crystals of the electrolytic copper plating layer is improved.

The term "ratio of an area of copper crystal grains oriented in the (100) plane orientation" as used herein refers to a ratio of an area of regions of copper crystal grains oriented in the (100) plane orientation relative to an area of the entire surface of the copper foil.

The amount of the palladium stacked per unit area of the surface of the copper foil is preferably 0.18 µg/cm² or more and 0.35 µg/cm² or less. When the amount of palladium stacked is within the above range, the amount of core of the catalyst generated by electroless copper plating is within an appropriate range. As a result, the electroless copper plating layer and the electrolytic copper plating layer that have the same orientation as that of copper crystal grains of the copper foil are probably less likely to be formed.

The ratio of the area of copper crystal grains oriented in the (100) plane orientation and present on the surface of the copper foil relative to the area of the surface of the copper foil is preferably 60% or more. When the ratio of the area of copper crystal grains oriented in the (100) plane orientation and present on the surface of the copper foil is within the above range, the effect of reducing partial abnormal growth of copper crystals of the electrolytic copper plating layer is improved.

The electroless copper plating layer preferably has an average thickness of 0.01 µm or more and 1.0 µm or less. When the electroless copper plating layer has an average thickness within the above range, the electrolytic copper plating layer can be uniformly formed, and it is possible to suppress the phenomenon that the orientation of copper crystal grains of the copper foil is carried over to crystal grains of copper deposited by electroless copper plating.

Details of Embodiments of Present Disclosure

Embodiments of a printed circuit board according to the present disclosure will be described in detail below with reference to the drawings.

<Printed Circuit Board>

FIG. 1 illustrates a printed circuit board—according to an embodiment of the present disclosure. A printed circuit board 20 includes an insulating base layer 1, a first conductive layer 2 that is stacked on a front surface of the base layer 1 either directly or indirectly and that includes copper foil, a second conductive layer 3 that is stacked on a back surface of the base layer 1 either directly or indirectly and that includes copper foil, and a via-hole laminate 10 that is stacked on an inner circumference and a bottom of a connection hole 5 extending through the first conductive layer 2 and the base layer 1 in a thickness direction and that electrically connects the first conductive layer 2 to the second conductive layer 3. A via-hole 4 for connecting patterns of different conductive layers to each other is formed by stacking the via-hole laminate 10 on the connection hole 5.

Each component of the printed circuit board will be described in detail below.

[Base Layer]

Examples of the material of the base layer 1 include polyamides, polyimides, polyamide-imides, and polyesters. Of these, polyamides, polyimides, and polyamide-imides are suitably used in view of, for example, mechanical strength such as heat resistance. The printed circuit board does not necessarily have flexibility.

The lower limit of the average thickness of the base layer 1 is preferably 5 µm, and more preferably 10 µm. On the other hand, the upper limit of the average thickness of the base layer 1 is preferably 100 µm, and more preferably 50 µm. If the average thickness of the base layer 1 is less than the lower limit, the base layer 1 may have insufficient strength. Conversely, if the average thickness of the base layer 1 exceeds the upper limit, flexibility may be insufficient.

[Conductive Layer]

The first conductive layer 2 and the second conductive layer 3 are formed by patterning copper foil stacked on the base layer 1. The copper foil contains copper crystal grains oriented in the (100) plane orientation, and the average crystal grain size of copper of the copper foil is 10 µm or more. Since the copper crystal grains of the copper foil have a plane orientation and an average crystal grain size within the above ranges, the copper foil has good mechanical properties such as flexibility.

The pattering of a conductor that forms the first conductive layer 2 and the second conductive layer 3 is usually performed after formation of a via-hole 4. To improve the wiring density, the first conductive layer 2 and the second conductive layer 3 may have a structure that have a land to which a via-hole 4 is connected, and a wiring pattern having a smaller width than the land and extending linearly.

The copper foil contains copper crystal grains oriented in the (100) plane orientation. The lower limit of the average crystal grain size of copper of the copper foil is 10 µm, and preferably 12 µm. The upper limit of the average crystal grain size of copper of the copper foil is not particularly limited, but may be, for example, 100 µm, and is preferably 80 µm, and more preferably 55 µm. Note that if the average crystal grain size of copper of the copper foil is less than 10 µm, an appearance defect on the surface of the electrolytic copper plating layer is unlikely to be generated in the first place, and thus the effects of this printed circuit board cannot be sufficiently achieved.

In the printed circuit board, the lower limit of the ratio of the area of copper crystal grains oriented in the (100) plane orientation and present on the surface of the copper foil relative to the area of the surface of the copper foil is preferably 40%, more preferably 60%, and still more preferably 80%. When the ratio of the area of copper crystal grains oriented in the (100) plane orientation and present on the surface of the copper foil relative to the area of the surface of the copper foil is within the above range, the effect of reducing partial abnormal growth of copper crystals of the electrolytic copper plating layer is improved. Note that if the ratio of the area is less than 40%, an appearance defect on the surface of the electrolytic copper plating layer is unlikely to be generated in the first place, and thus the effects of this printed circuit board cannot be sufficiently achieved.

The method for causing the ratio of the area of copper crystal grains oriented in the (100) plane orientation and present on the surface of the copper foil relative to the area of the surface of the copper foil to fall within a predetermined range is not particularly limited. The ratio within a predetermined range can be achieved by, for example, controlling an element content, controlling rolling conditions, or conducting heat treatment.

The lower limit of the average thickness of the first conductive layer 2 and the second conductive layer 3 is preferably 2 µm, and more preferably 5 µm from the viewpoint of ensuring sufficient electrical conductivity. On the other hand, the upper limit of the average thickness of the first conductive layer 2 and the second conductive layer 3 is preferably 100 µm, and more preferably 50 µm from the viewpoint of circuit formability.

[Via-Hole Laminate]

The via-hole laminate 10 has an electroless copper plating layer 8 stacked on the inner circumference and the bottom of the connection hole 5, and an electrolytic copper plating layer 7 stacked on a surface of the electroless copper plating layer 8. The via-hole laminate 10 is stacked on the inner circumference and the bottom of the connection hole 5 extending through the first conductive layer 2 and the base layer 1 in the thickness direction. The via-hole laminate 10 electrically connects the first conductive layer 2 to the second conductive layer 3. More specifically, the via-hole laminate 10 may have a structure that has an electroless copper plating layer 8 stacked on the inner circumference of the connection hole 5, a surface of the first conductive layer 2 opposite to the base layer 1, and a surface of the second conductive layer 3 (that is, the bottom), the surface being exposed to the inside of the connection hole 5, and an electrolytic copper plating layer 7 further stacked on the electroless copper plating layer 8.

Figure 2:
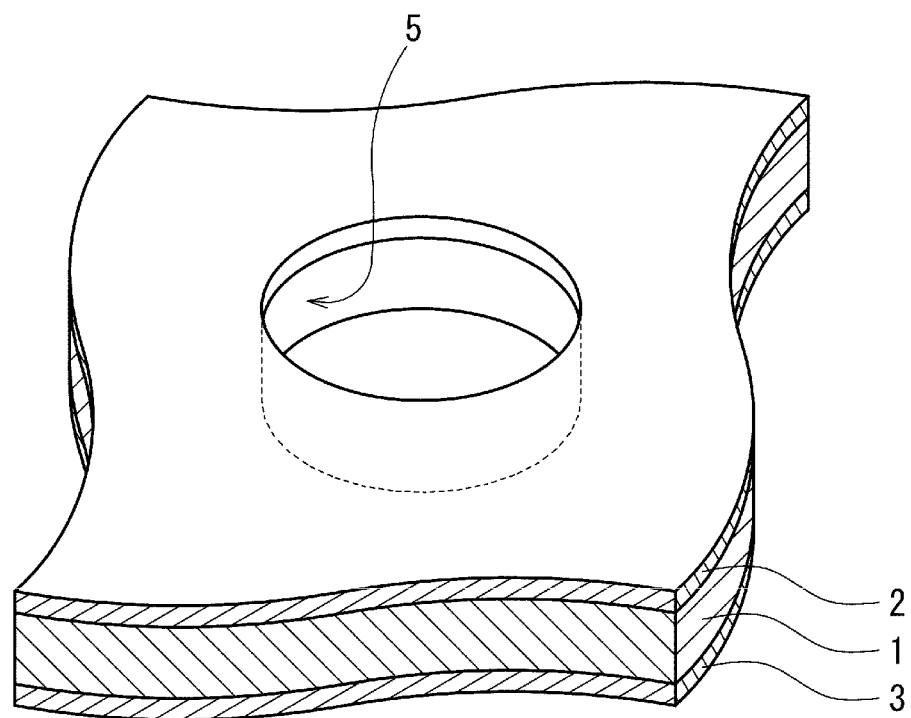
FIG. 2 is a schematic perspective view illustrating a connection hole of the printed circuit board in FIG. 1.

To illustrate the shape of the connection hole 5, FIG. 2 illustrates the connection hole 5 in a state before formation of the via-hole 4 and patterning of the first conductive layer 2 and the second conductive layer 3 are performed. The connection hole 5 is defined by a cylindrical surface that extends through the base layer 1 and the first conductive layer 2 in the thickness direction and that forms the connection hole 5. The via-hole laminate 10 is stacked on the connection hole 5 to thereby form the via-hole 4 for connecting patterns of the first conductive layer 2 and the second conductive layer to each other.

(Electroless Copper Plating Layer)

The electroless copper plating layer 8 is a thin electrically conductive layer and is used as an adherend when the electrolytic copper plating layer 7 is formed by electrolytic copper plating. This electroless copper plating layer 8 can be formed of copper stacked by electroless copper plating. Copper plating is suitable for a printed circuit board because of its good flexibility, good thick-film formability, good adhesion to copper electroplating, and high electrical conductivity. This electroless copper plating is a process of depositing a metal having a catalytic activity by a reducing action of a catalyst and can be performed by applying a commercially available electroless copper plating solution. Thus, the use of electroless copper plating enables the electroless copper plating layer 8 to be simply and easily stacked and enables the electrolytic copper plating layer 7 to be further stacked reliably.

The lower limit of the average thickness of the electroless copper plating layer 8 is preferably 0.05 µm, and more preferably 0.10 µm. On the other hand, the upper limit of the average thickness of the electroless copper plating layer 8 is preferably 1.0 µm, and more preferably 0.5 µm. If the average thickness of the electroless copper plating layer 8 is less than the lower limit, the continuity of the electroless copper plating layer 8 may not be ensured, and the electrolytic copper plating layer 7 may not be uniformly formed. If the average thickness is less than the lower limit, the orientation of copper crystal grains of the copper foil may tend to be carried over to crystal grains of copper deposited by electroless copper plating. On the other hand, if the average thickness of the electroless copper plating layer 8 exceeds the upper limit, the cost may be unnecessarily increased. When the average thickness of the electroless copper plating layer is within the above range, the electrolytic copper plating layer can be uniformly formed, and it is possible to suppress the phenomenon that the orientation of copper crystal grains of the copper foil is carried over to crystal grains of copper deposited by electroless copper plating.

The electroless copper plating layer 8 includes palladium and tin as a catalyst. Palladium and tin are added as a catalyst before an electroless copper plating layer stacking step described later, and an electroless copper plating layer is stacked thereon. Therefore, palladium and tin are present in the electroless copper plating layer at a high content near the interface with the conductive layer. The electroless copper plating layer 8 of the printed circuit board 20 includes palladium, and this suppresses the phenomenon that the orientation of copper crystal grains of the copper foil is carried over to crystal grains of copper deposited by electroless copper plating. As a result, the formation of irregularities on the surface of the electrolytic copper plating layer 7 due to abnormal growth of copper crystals of the electrolytic copper plating layer 7 is reduced. Accordingly, in the printed circuit board 20, it is possible to reduce erroneous detection in an appearance inspection with an automated optical inspection system and separation of a bottom portion of the via-hole 4 from the second conductive layer 3. Furthermore, since the electroless copper plating layer includes tin in addition to palladium, the catalyst has a form of a tin-palladium colloidal solution. Accordingly, since the amount of palladium stacked on the copper foil is easily increased, it is possible to further enhance the effect of reducing the formation of an electroless copper plating layer having the same orientation as that of copper crystal grains of the copper foil. Thus, it is possible to improve the effect of reducing erroneous detection in an appearance inspection with an automated optical inspection system and separation of a bottom portion of the via-hole.

The lower limit of the amount of palladium stacked per unit area of a surface of the copper foil is 0.18 µg/cm², and more preferably 0.20 µg/cm². The upper limit of the amount of palladium stacked is 0.40 µg/cm², and preferably 0.35 µg/cm². When the amount of palladium stacked is within the above range, the amount of core of the catalyst generated by electroless copper plating is within an appropriate range. As a result, the electroless copper plating layer 8 and the electrolytic copper plating layer 7 that have the same orientation as that of copper crystal grains of the copper foil are probably less likely to be formed. If the amount of palladium stacked exceeds the upper limit, connection strength between the copper foil included in the second conductive layer 3 and the electroless copper plating layer 8 and electrolytic copper plating layer 7 at the bottom portion of the via-hole 4 decreases, which may result in separation of the bottom portion of the via-hole 4.

The lower limit of the amount of tin stacked per unit area of the surface of the copper foil is preferably 0.05 µg/cm², more preferably 0.08 µg/cm², and still more preferably 0.15 µg/cm². The upper limit of the amount of tin stacked is preferably 1.20 µg/cm², and more preferably 0.50 µg/cm². If the amount of tin stacked exceeds the upper limit, the amount of palladium that can function as a catalyst is reduced, and thus electroless copper plating may not proceed. When the amount of tin stacked is within the above range, the amount of palladium stacked on the copper foil can be adjusted to a satisfactory range, and it is possible to further improve the effect of reducing the formation of an electroless copper plating layer having the same orientation as that of copper crystal grains of the copper foil.

(Electrolytic Copper Plating Layer)

The electrolytic copper plating layer 7 is stacked on the surface of the electroless copper plating layer 8 by electrolytic copper plating. By forming the electroless copper plating layer 8 and then providing the electrolytic copper plating layer 7 on the inner circumference and the bottom of the electroless copper plating layer 8 in this manner, the via-hole 4 having good electrical conductivity can be easily and reliably formed. Copper is suitably used as a metal that forms the electrolytic copper plating layer because copper is cheap and has high electrical conductivity, as described above.

The lower limit of the average thickness of the electrolytic copper plating layer 7 is preferably 1 µm, and more preferably 5 µm. On the other hand, the upper limit of the average thickness of the electrolytic copper plating layer 7 is preferably 50 µm, and more preferably 30 µm. If the average thickness of the electrolytic copper plating layer 7 is less than the lower limit, the via-hole 4 may be broken by, for example, bending of the printed circuit board 20, and electrical connection between the first conductive layer 2 and the second conductive layer 3 may be disconnected. If the average thickness is less than the lower limit, the orientation of copper crystal grains of the copper foil may tend to be carried over to crystal grains of copper deposited by electrolytic copper plating. On the other hand, if the average thickness of the electrolytic copper plating layer 7 exceeds the upper limit, the printed circuit board 20 may have an excessively large thickness, or the production cost may be unnecessarily increased.

[Method for Producing Printed Circuit Board]

A method for producing the printed circuit board includes, for example, a conductive layer stacking step of stacking, on a front surface of a base layer, a first conductive layer including copper foil, and stacking, on a back surface of the base layer, a second conductive layer including copper foil; a connection hole forming step of forming a connection hole extending through the first conductive layer and the base layer in a thickness direction; an electroless copper plating pretreatment step of performing pretreatment before an inner circumference and a bottom of the connection hole are subjected to electroless copper plating; an electroless copper plating layer stacking step of stacking an electroless copper plating layer on the inner circumference and the bottom of the connection hole that have been subjected to the electroless copper plating pretreatment; and an electrolytic copper plating layer stacking step of stacking an electrolytic copper plating layer on a surface of the electroless copper plating layer.

(Conductive Layer Stacking Step)

In the conductive layer stacking step, the above-described copper foil is stacked on a front surface of a base layer to form a first conductive layer. Furthermore, the above-described copper foil is stacked on a back surface of the base layer to form a second conductive layer. In the conductive layer stacking step, conductive patterns are formed on the surfaces of the base layer by a publicly known method.

The method for stacking the copper foil constituting the first conductive layer and the second conductive layer on the base layer is not particularly limited. Examples of the method that can be used include a bonding method of bonding copper foil with an adhesive, a casting method of applying, onto copper foil, a resin composition serving as a material of a base layer, a sputtering/plating method of forming copper foil by plating on a thin conductive layer (seed layer) formed on a base layer by sputtering or vapor deposition and having a thickness of several nanometers, and a lamination method of bonding copper foil to a base layer by heat pressing.

(Connection Hole Forming Step)

The method for forming a hole for electrically connecting the first conductive layer and the second conductive layer to each other is not particularly limited. An example of the method that can be used is a method in which the first conductive layer and the base layer are perforated with a microdrill or laser to expose the copper foil of the second conductive layer.

(Electroless Copper Plating Pretreatment Step)

In the electroless copper plating pretreatment step, pretreatment is performed before the inner circumference and the bottom of the connection hole are subjected to electroless copper plating. In this step, for example, a cleaner step, an acid treatment step, a pre-dip step, a catalyst treatment step, a reduction step, and the like are performed.

In the pre-dip step, before dipping in a catalyst liquid, dipping is performed in, for example, a liquid from which a catalyst has been removed from the catalyst liquid. Through the pre-dip step, water adhering to the surfaces of the conductive patterns is replaced, so that the catalyst easily adheres to the surfaces of the base layer. This enables generation of variation in the dispersion state of the catalyst to be reduced in the subsequent catalyst treatment step.

In the catalyst treatment step, the laminate that includes the base layer and the conductive layers is immersed in a solution including colloids of palladium and tin. After the catalyst treatment step, a water washing step is performed. As described above, the catalyst treatment step using palladium and tin is performed after the conductive layer stacking step and before the electroless copper plating layer stacking step. Therefore, palladium and tin are present in the electroless copper plating layer at a high content near the interfaces with the conductive layers.

In the reduction step, the catalyst is reduced. Specifically, in the reduction step, a palladium ion ($Pd^{2+}$) is reduced and converted to palladium ($Pd^0$), and the palladium $Pd^0$ is formed on the surfaces and serves as a core of a catalyst. Thus, a palladium catalyst is supported on the surfaces of the conductive patterns. After the reduction step, a water washing step is performed.

(Electroless Copper Plating Layer Stacking Step)

In the electroless copper plating layer stacking step, the inner circumference and the bottom of the connection hole are subjected to electroless copper plating to form an electroless copper plating layer. In the electroless copper plating step, the laminate that includes the base layer and the conductive layers is immersed in an electroless copper plating solution in which a plating reaction is activated by heating to stack copper on the surfaces of the conductive patterns. The electroless copper plating solution is preferably an alkaline bath.

The lower limit of the heating temperature of the electroless copper plating solution is preferably 20° C. On the other hand, the upper limit of the heating temperature of the electroless copper plating solution is preferably 40° C. If the heating temperature of the electroless copper plating solution is less than the lower limit, the plating reaction may be insufficient. On the other hand, if the heating temperature of the electroless copper plating solution exceeds the upper limit, it may become difficult to adjust the thickness of the electroless copper plating layer to be formed.

The lower limit of the immersion time in the electroless copper plating solution is preferably one minute, and more preferably two minutes. On the other hand, the upper limit of the immersion time in the electroless copper plating solution is preferably 30 minutes, and more preferably 20 minutes. If the immersion time in the electroless copper plating solution is less than the lower limit, an electroless copper plating layer having a sufficient thickness may not be formed. On the other hand, if the immersion time in the electroless copper plating solution exceeds the upper limit, erosion of a conductive pattern due to the local cell action may not be sufficiently prevented.

(Electrolytic Copper Plating Layer Stacking Step)

In the electrolytic copper plating layer stacking step, an electrolytic copper plating layer is stacked on the surface of the electroless copper plating layer by electrolytic copper plating. The thickness of the via-hole laminate is increased up to a desired thickness in this electrolytic copper plating step.

In the electrolytic copper plating layer stacking step of forming an electrolytic copper plating layer, a metal is stacked by electrolytic copper plating using the electroless copper plating layer as an adherend to form an electrolytic copper plating layer in contact with the inner circumference and the bottom of the electroless copper plating layer. Thus, a via-hole having a sufficient thickness can be formed.

According to this printed circuit board, the formation of irregularities on the surface of the electrolytic copper plating layer of the via-hole laminate is reduced in the case of using, as conductive layers, copper foil which has an average crystal grain size of 10 μm or more and whose copper crystal grains are oriented in the (100) plane orientation. Accordingly, in the printed circuit board, erroneous detection in an appearance inspection with an automated optical inspection system and separation of a bottom portion of the via-hole can be reduced. Thus, the printed circuit board can be particularly suitably used as a flexible printed circuit board used in, for example, compact portable electronic devices.

Other Embodiments

It is to be understood that the embodiments disclosed herein are only illustrative and non-restrictive in all respects. The scope of the present disclosure is not limited to the configurations of the embodiments but is defined by the appended claims. The scope of the present disclosure is intended to cover all modifications within the meaning and scope equivalent to those of the claims.

In the printed circuit board, the first conductive layer and the second conductive layer are relative conductive layers. A conductive layer serving as a first conductive layer in one via-hole may function as a second conductive layer in another via-hole.

The printed circuit board may be a multilayer circuit board in which an additional base layer and an additional conductive layer are stacked. The printed circuit board may include other layers such as a coverlay, a solder resist, or a shield film. Via-holes in the case where the printed circuit board is a multilayer circuit board may be via-holes extending through multiple layers.

EXAMPLES

The present disclosure will be described in detail below by way of Examples. The description of Examples does not limit the interpretation of the present disclosure.

[No. 1 to No. 8]

ESPANEX (copper 12 μm/polyimide 12 μm/copper 12 μm) manufactured by NIPPON STEEL & SUMIKIN CHEMICAL CO., LTD. was used as a base. Copper foil mainly oriented in the (100) plane orientation and having an average crystal grain size of 50 μM was stacked on a front surface and a back surface of the base to form a conductive layer on each of the front surface and the back surface of the base (conductive layer stacking step). Copper of the surface layer and the polyimide in the resulting sample were removed with a UV laser to form a via-hole (connection hole forming step). Next, substantially the entire surface of front surfaces of the conductive layers was subjected to electroless copper plating pretreatment (electroless copper plating pretreatment step). In the electroless copper plating pretreatment step, the sample was immersed in a colloidal solution (catalyst) of palladium and tin to perform catalyst treatment. The conditions for the electroless copper plating pretreatment step in Nos. 1 to 8 were as follows.

(Conditions for Electroless Copper Plating Pretreatment Step)

(1) No. 1

The following was performed.

Cleaner→Soft etching (30 seconds)→Pickling→Pre-dip→Catalyst (normal palladium concentration: 0.13 g/L, tin concentration: 6 g/L)→Electroless copper plating (2) No. 2

The following was performed.

Cleaner→Soft etching (60 seconds)→Pickling→Pre-dip→Catalyst (palladium concentration in solution, 1.5 times: 0.2 g/L, tin concentration: 9 g/L)→Electroless copper plating (3) No. 3

The following was performed.

Cleaner→Soft etching (60 seconds)→Pickling→Pre-dip→Catalyst (normal palladium concentration: 0.13 g/L, tin concentration: 6 g/L)→Electroless copper plating (4) No. 4

The following was performed.

Cleaner→Soft etching (60 seconds)→Pickling→Pre-dip→Catalyst (palladium concentration in solution, 3 times: 0.4 g/L, tin concentration: 18 g/L)→Electroless copper plating (5) No. 5

The following was performed.

Cleaner→Soft etching (60 seconds)→Pickling→Pre-dip→Catalyst (normal palladium concentration: 0.13 g/L, tin concentration: 6 g/L)→Electroless copper plating (6) No. 6

The following was performed.

Cleaner→Soft etching (60 seconds)→Pickling→Pre-dip→Catalyst (palladium concentration in solution, 1.5 times: 0.2 g/L, tin concentration: 9 g/L)→Electroless copper plating (7) No. 7

The following was performed.

Cleaner→Soft etching (60 seconds)→Pickling→Pre-dip→Catalyst (normal palladium concentration: 0.13 g/L, tin concentration: 6 g/L)→Electroless copper plating (8) No. 8

The following was performed.

Cleaner→Soft etching (60 seconds)→Pickling→Pre-dip→Catalyst (palladium concentration in solution, 1.5 times: 0.2 g/L, tin concentration: 9 g/L)→Electroless copper plating Electroless copper plating was performed at 23° C. for 15 minutes to stack an electroless copper plating layer having an average thickness of 0.10 μm (electroless copper plating layer stacking step). Subsequently, a current density was adjusted to 2 A/dm² with respect to the exposed area of the conductive layers, and electrolytic copper plating was performed at 25° C. for 28 minutes. An electrolytic copper plating layer having an average thickness of 12 μm was stacked (electrolytic copper plating layer stacking step).

[Evaluation]

(Measurement of Amounts of Palladium and Tin Stacked)

Each of the printed circuit boards of Nos. 1 to 8 was cut to a size of 20 mm×20 mm and dissolved in a mixed solution of nitric acid and hydrochloric acid. The resulting solution was then analyzed by inductively coupled plasma-mass spectrometry (ICP-MS) to measure the amounts of palladium and tin stacked on the copper foil.

(Erroneous Detection Frequency in Appearance Inspection with Automated Optical Inspection System)

One hundred samples of each of the printed circuit boards of Nos. 1 to 8 were prepared. An appearance inspection of the plurality of printed circuit boards was performed by using an automated optical inspection system. Next, regarding printed circuit boards of each of Nos. 1 to 8 in which an appearance defect was detected by the automated optical inspection system, the presence or absence of an exact appearance defect was visually inspected with an optical microscope. A ratio of erroneous detection in the appearance inspection with the automated optical inspection system was calculated for the printed circuit boards of each of Nos. 1 to 8 and evaluated according to the following three grades. Samples evaluated as A and samples evaluated as B were determined to be acceptable.

A: The erroneous detection ratio is 0% or more and less than 6%.

B: The erroneous detection ratio is 6% or more and less than 16%.

C: The erroneous detection ratio is 16% or more.

(Occurrence Ratio of Separation of Bottom Portion of Via-Hole)

Separation of a bottom portion of a via-hole was visually inspected with an optical microscope. Regarding an occurrence ratio of separation of a bottom portion of a via-hole in the printed circuit boards of each of Nos. 1 to 8, a ratio of printed circuit boards in which separation of a bottom portion of a via-hole was observed in 100 printed circuit boards of each test number was calculated and evaluated according to the following two grades. From the evaluation results, samples evaluated as A were determined to be acceptable.

A: The separation ratio is 0% or more and less than 3%.

B: The separation ratio is 3% or more.

Table 1 shows the evaluation results.

TABLE 1

| | Copper foil of conductive layer | | | Amount of palladium stacked on copper foil (μg/cm²) | Amount of tin stacked on copper foil (μg/cm²) | Appearance defect detected by automated optical inspection system | | Separation of bottom portion of via-hole | |
|---|---|---|---|---|---|---|---|---|---|
| Test number | Ratio of area of crystal grains in (100) plane orientation (%) | Average crystal grain size (μm) | Form of catalyst | | | Erroneous detection ratio (%) | Determination | Occurrence ratio (%) | Determination |
| No. 1 | 90 | 50 | Colloid | 0.310 | 0.21 | 0 | A | 0 | A |
| No. 2 | 90 | 50 | Colloid | 0.185 | 0.15 | 5 | A | 0 | A |
| No. 3 | 90 | 50 | Colloid | 0.160 | 0.14 | 21 | C | 0 | A |
| No. 4 | 90 | 50 | Colloid | 0.413 | 0.25 | 0 | A | 3 | B |
| No. 5 | 60 | 13 | Colloid | 0.161 | 0.14 | 17 | C | 0 | A |
| No. 6 | 60 | 13 | Colloid | 0.183 | 0.14 | 4 | A | 0 | A |
| No. 7 | 40 | 15 | Colloid | 0.158 | 0.13 | 24 | C | 0 | A |
| No. 8 | 40 | 15 | Colloid | 0.185 | 0.09 | 9 | B | 0 | A |

As shown in Table 1, test Nos. 1 to 2, test No. 6, and test No. 8, in which the average crystal grain size of copper of the copper foil was 10 μm or more, and the amount of palladium stacked per unit area of the surface of the copper foil was 0.18 μg/cm² or more and 0.40 μg/cm² or less, had a good effect of reducing the erroneous detection in the appearance inspection with the automated optical inspection system and separation of a bottom portion of a via-hole. In particular, of these, test Nos. 1 to 2 and test No. 6, in which the ratio of the area of copper crystal grains oriented in the (100) plane orientation and present on the surface of the copper foil relative to the area of the surface of the copper foil was 50% or more, had an excellent effect of reducing the erroneous detection in the appearance inspection with the automated optical inspection system and separation of a bottom portion of a via-hole.

In contrast, test No. 3, test No. 5, and test No. 7, in which the amount of palladium stacked per unit area of the surface of the copper foil was less than 0.18 μg/cm², had a poor effect of reducing the erroneous detection in the appearance inspection with the automated optical inspection system. Test No. 4, in which the amount of the palladium stacked per unit area of the surface of the copper foil exceeded 0.40 μg/cm², had a poor effect of reducing separation of a bottom portion of a via-hole.

REFERENCE SIGNS LIST 1 base layer
2 first conductive layer
3 second conductive layer
4 via-hole
5 connection hole
7 electrolytic copper plating layer
8 electroless copper plating layer
10 via-hole laminate
20 printed circuit board

The invention claimed is:
1. A printed circuit board comprising:
an insulating base layer;
a first conductive layer that is stacked on a front surface of the base layer either directly or indirectly and that includes copper foil;
a second conductive layer that is stacked on a back surface of the base layer either directly or indirectly and that includes copper foil; and
a via-hole laminate that is stacked on an inner circumference and a bottom of a connection hole extending through the first conductive layer and the base layer in a thickness direction and that electrically connects the first conductive layer to the second conductive layer,
wherein the via-hole laminate has an electroless copper plating layer that is stacked on the inner circumference and the bottom of the connection hole and an electrolytic copper plating layer stacked on a surface of the electroless copper plating layer,
the copper foil contains copper crystal grains oriented in a (100) plane orientation, and an average crystal grain size of copper of the copper foil is 10 μm or more,
the electroless copper plating layer includes palladium and tin, and
an amount of the palladium stacked per unit area of a surface of the copper foil is 0.18 μg/cm² or more and 0.40 μg/cm² or less.

2. The printed circuit board according to claim 1, wherein an amount of the tin stacked per unit area of the surface of the copper foil is 0.05 μg/cm² or more and 1.20 μg/cm² or less.

3. The printed circuit board according to claim 1, wherein a ratio of an area of copper crystal grains oriented in the (100) plane orientation and present on the surface of the copper foil relative to an area of the surface of the copper foil is 50% or more.

4. The printed circuit board according to claim 1, wherein the amount of the palladium stacked per unit area of the surface of the copper foil is 0.18 μg/cm² or more and 0.35 μg/cm² or less.

5. The printed circuit board according to claim 1, wherein a ratio of an area of copper crystal grains oriented in the (100) plane orientation and present on the surface of the copper foil relative to an area of the surface of the copper foil is 60% or more.

6. The printed circuit board according to claim 1, wherein the electroless copper plating layer has an average thickness of 0.01 μm or more and 1.0 μm.

* * * * *